United States Patent
Rivkin et al.

(10) Patent No.: US 7,800,938 B2
(45) Date of Patent: Sep. 21, 2010

(54) OSCILLATING CURRENT ASSISTED SPIN TORQUE MAGNETIC MEMORY

(75) Inventors: Kirill Rivkin, Edina, MN (US); Yiran Chen, Eden Prairie, MN (US); Xiaobin Wang, Chanhassen, MN (US); Haiwen Xi, Prior Lake, MN (US)

(73) Assignee: Seagate Technology, LLC, Scotts Valley, CA (US)

(*) Notice: Subject to any disclaimer, the term of this patent is extended or adjusted under 35 U.S.C. 154(b) by 91 days.

(21) Appl. No.: 12/251,603

(22) Filed: Oct. 15, 2008

(65) Prior Publication Data

US 2010/0034017 A1    Feb. 11, 2010

Related U.S. Application Data

(60) Provisional application No. 61/086,864, filed on Aug. 7, 2008.

(51) Int. Cl.
  *G11C 11/00* (2006.01)
(52) U.S. Cl. ............... 365/158; 365/171; 365/173
(58) Field of Classification Search ............ 365/158, 365/171, 173
  See application file for complete search history.

(56) References Cited

U.S. PATENT DOCUMENTS

| | | | |
|---|---|---|---|
| 7,180,113 B2 | 2/2007 | Braun | |
| 7,224,601 B2* | 5/2007 | Panchula | 365/158 |
| 7,227,773 B1* | 6/2007 | Nguyen et al. | 365/158 |
| 7,502,249 B1 | 3/2009 | Ding | |
| 7,515,457 B2 | 4/2009 | Chen | |
| 7,525,862 B1* | 4/2009 | Sun et al. | 365/225.5 |
| 2008/0019040 A1 | 1/2008 | Zhu | |
| 2008/0137224 A1 | 6/2008 | Gao | |
| 2008/0225584 A1 | 9/2008 | Gao | |
| 2008/0273380 A1 | 11/2008 | Diao | |
| 2008/0310213 A1 | 12/2008 | Chen | |
| 2009/0040855 A1 | 2/2009 | Luo | |
| 2009/0185410 A1 | 7/2009 | Huai | |

OTHER PUBLICATIONS

S.H. Florez, et al., Modification of Critical Spin Torque Current Induced by rf Excitation, Journal of Applied Physics 103, 07A708 (2008).
K. Rivkin, et al., Magnetization Reversal in the Anisotropy-Dominated Regime Using Time-Dependent Magnetic Fields, Applied Physics Letters 89, 252507 (2006).

* cited by examiner

*Primary Examiner*—Son Dinh
*Assistant Examiner*—Nam Nguyen
(74) *Attorney, Agent, or Firm*—Campbell Nelson Whipps LLC

(57) ABSTRACT

A memory unit having a spin torque memory cell with a ferromagnetic free layer, a ferromagnetic pinned layer and a spacer layer therebetween, with the free layer having a switchable magnetization orientation with a switching threshold. A DC current source is electrically connected to the spin torque memory cell to cause spin transfer torque in the free layer. An AC current source is electrically connected to the spin torque memory cell to produce an oscillatory polarized current capable of spin transfer torque via resonant coupling with the free layer.

23 Claims, 3 Drawing Sheets

OSCILLATING CURRENT ASSISTED SPIN TORQUE MAGNETIC MEMORY

RELATED APPLICATIONS

This application claims priority to U.S. provisional patent application No. 61/086,864, filed on Aug. 7, 2008. The entire disclosure of application No. 61/086,864 is incorporated herein by reference.

BACKGROUND

Spin torque transfer technology, also referred to as spin electronics, which is based on changing magnetic state of the system by momentum transfer to conduction electrons, is a recent development. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. One particular type of such elements is what is referred to as a "spin tunneling junction," "spin torque memory", "spin torque memory cell", and the like. When the magnetization orientations of the free layer and pinned layer are parallel, the resistance of the element is low. When the magnetization orientations of the free layer and the pinned layer are antiparallel, the resistance of the element is high. The magnetization orientation is switched by passing a current either parallel across the layers or perpendicularly through the layers.

At least because of their small size, it is desirous to use spin torque memory cell elements in many applications, such as random access memory. However, their small size also creates issues.

One problem is an excessive heat generation caused by the use of currents with high amplitude to switch the magnetization orientation of the memory cells. Among other things, this temperature increase reduces the stability of the magnetic elements. Another problem is a relatively long typical switching time (e.g., many nanoseconds) of such elements.

BRIEF SUMMARY

The present disclosure relates to a spin torque-based magnetic memory that uses a time dependent AC current in conjunction with a DC current to reduce the switching current needed and to improve the switching performance of the memory cell. The memory includes a spin torque memory cell having a switchable magnetic layer that functions as a memory element and another magnetic layer that polarizes the AC current at least partially in the direction perpendicular to the memory element's magnetization.

In one particular embodiment, a magnetic memory unit is provided, the memory unit having a spin torque memory cell having a ferromagnetic free layer, at least one ferromagnetic pinned layer and a spacer layer therebetween, with the free layer having a switchable magnetization orientation with a switching threshold. A DC current source is electrically connected to the spin torque memory cell to cause spin transfer torque in the free layer. An AC current source is electrically connected to the spin torque memory cell to produce an oscillatory polarized current capable of spin transfer torque via resonant coupling with the free layer.

In another particular embodiment, a magnetic memory unit is provided that has a spin torque memory cell having a ferromagnetic free layer, at least one ferromagnetic pinned layer and a spacer layer therebetween, with the free layer having a switchable magnetization orientation with a switching threshold. The memory unit includes a spin transfer torque source electrically connected to the memory cell to provide spin transfer torque in the free layer, the source comprising a DC current source and a polarized AC current source.

In yet another particular embodiment, a magnetic memory unit is provided that has a spin torque memory cell having a ferromagnetic free layer, at least one ferromagnetic pinned layer and a spacer layer therebetween, with the free layer having a switchable magnetization orientation. A DC current source is electrically connected to the spin torque memory cell to cause spin transfer torque in the free layer, and an AC current source is electrically connected to the spin torque memory cell, wherein the spin torque memory cell polarizes the AC current at least partially in a direction perpendicular to the magnetization orientation of the free layer.

In another particulare embodiment of this disclosure, a method of switching the magnetization orientation of a free layer of a spin torque magnetic memory cell is provided. The method includes passing a DC current through the spin torque memory cell to cause spin transfer torque in the free layer, and passing an AC current through the spin torque memory cell to produce an oscillatory polarized current capable of spin transfer torque via resonant coupling with the free layer.

In any of these embodiments, the AC polarized current can be generated by the DC current, due to the precession of the magnetization in the pinned layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
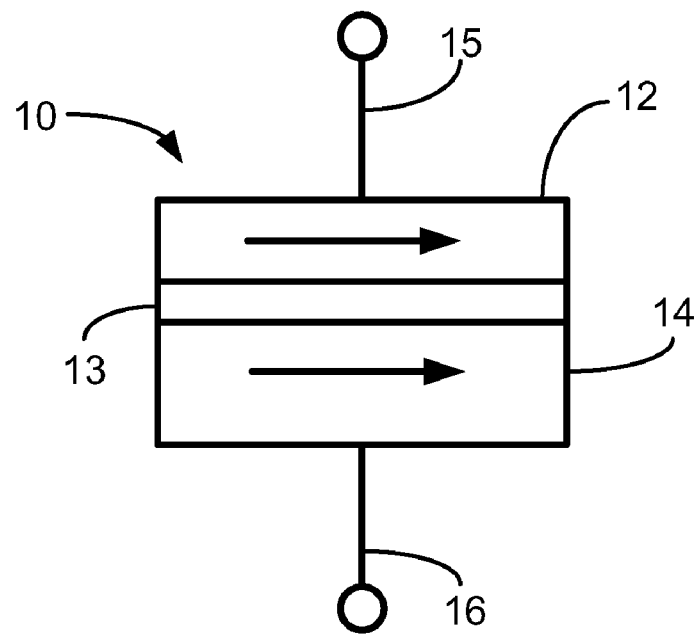
FIG. 1A is a cross-sectional schematic diagram of an illustrative spin torque memory cell in a low resistance state.

This disclosure is directed to devices that utilize an oscillating polarized AC current applied to a spin torque memory cell to reduce the switching current needed to change the resistance state of the spin torque memory cell. The AC current may have time dependency corresponding to a sinusoid with constant or time dependent frequency or some other form, such as series of square pulses.

One particular embodiment of this disclosure is a magnetic memory unit that has a spin torque memory cell having a ferromagnetic free layer, a ferromagnetic pinned layer and a spacer layer therebetween. A DC current source is electrically connected to the spin torque memory cell to cause spin transfer torque in the free layer, and an AC current source is also electrically connected to the spin torque memory cell to produce a fast varying time dependent polarized current which is capable of resonant coupling with the free layer. The AC current source may utilize the DC current and use precession of magnetization to generate the oscillatory polarized current. The oscillating spin transfer torque produced by the AC current and by the DC current in combination, or by the AC current alone, exceed the magnetization orientation switching threshold of the free layer, and thus change the magnetization orientation of the free magnetic layer when the AC current and the DC current are simultaneously applied to the memory cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin torque-based magnetic memory that uses a time dependent current to reduce the switching current needed and improve the switching performance of the memory cell. The memory includes a spin torque memory cell having a switchable magnetic layer that functions as a memory element and another magnetic layer that polarizes the AC current at least partially in the direction perpendicular to the memory element's magnetization. While the present disclosure is not so limited, an appreciation of various aspects of the disclosure will be gained through a discussion of the examples provided below.

Figure 1B:
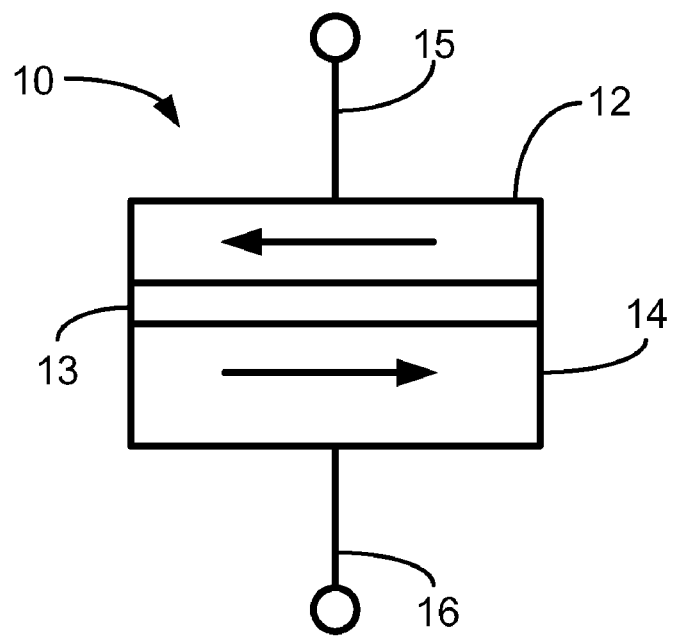
FIG. 1B is a cross-sectional schematic diagram of the spin torque memory cell in a high resistance state.

FIGS. 1A and 1B are a cross-sectional schematic diagram of a generic spin torque memory cell 10; in FIG. 1A, cell 10 is in the low resistance state, with the magnetization orientations parallel and in FIG. 1B, cell 10 is in the high resistance state, with the magnetization orientations anti-parallel.

Spin torque memory cell 10 includes a ferromagnetic free layer 12 and a ferromagnetic reference (i.e., pinned) layer 14. Ferromagnetic free layer 12 and ferromagnetic pinned layer 14 are separated by a non-magnetic material 13 which may serve as a barrier layer in the magnetic tunnel junction configuration. Ferromagnetic layers 12, 14 may be made of any useful ferromagnetic (FM) material such as, for example, Fe, Co or Ni and alloys thereof, such as NiFe and CoFe. Either or both of free layer 12 and pinned layer 14 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Non-magnetic layer 13 may be made of an electrically insulating material such as, for example an oxide material (e.g., $Al_2O_3$, TiOx or MgO). Other suitable materials may also be used. Non-magnetic layer 13 could optionally be patterned with free layer 12 or with pinned layer 14, depending on process feasibility and device reliability.

The following are various specific examples of spin torque memory cells 10. In some embodiments of spin torque memory cell 10, oxide barrier layer 13 includes $Ta_2O_5$ (for example, at a thickness of about 0.5 to 1 nanometer) and ferromagnetic free layer 12 and a ferromagnetic pinned layer 14 include NiFe, CoFe, or Co. In other embodiments of spin torque memory cell 10, barrier layer 13 includes GaAs (for example, at a thickness of about 5 to 15 nanometers) and ferromagnetic free layer 12 and ferromagnetic pinned layer 14 include Fe. In yet other embodiments of spin torque memory cell 10, barrier layer 13 includes $Al_2O_3$ (for example, a few nanometers thick) and ferromagnetic free layer 12 and ferromagnetic pinned layer 14 include NiFe, CoFe, or Co.

A first electrode 15 is in electrical contact with ferromagnetic free layer 12 and a second electrode 16 is in electrical contact with ferromagnetic pinned layer 14. Electrodes 15, 16 electrically connect ferromagnetic layers 12, 14 to a control circuit providing read and write currents through layers 12, 14. The resistance across spin torque memory cell 10 is determined by the relative orientation of the magnetization vectors or magnetization orientations of ferromagnetic layers 12, 14. The magnetization direction of ferromagnetic pinned layer 14 is pinned in a predetermined direction while the magnetization direction of ferromagnetic free layer 12 is free to rotate under the influence of spin torque. One of the methods to achieve pinning of ferromagnetic pinned layer 14 is by exchange bias with an antiferromagnetically ordered material (AFM) such as PtMn, IrMn, and others.

FIG. 1A illustrates spin torque memory cell 10 in the low resistance state where the magnetization orientation of ferromagnetic free layer 12 is parallel and in the same direction of the magnetization orientation of ferromagnetic pinned layer 14. This is termed the low resistance state and can be chosen as one of two memory states, for example, the "0" data state. FIG. 1B illustrates spin torque memory cell 10 in the high resistance state where the magnetization orientation of ferromagnetic free layer 12 is anti-parallel and in the opposite direction of the magnetization orientation of ferromagnetic pinned layer 14. This is termed the high resistance state or the "1" data state.

Switching the resistance state and hence the data state of spin torque memory cell 10 via spin-transfer occurs when a current, under the influence of a magnetic layer of spin torque memory cell 10, becomes spin polarized and imparts a spin torque on free layer 12 of spin torque memory cell 10. When a sufficient level of polarized current and therefore spin torque is applied to free layer 12, the magnetization orientation of free layer 12 can be switched between two opposite directions and accordingly, spin torque memory cell 10 can be switched between the parallel state (i.e., low resistance state or "0" data state) and anti-parallel state (i.e., high resistance state or "11" data state).

The illustrative spin-transfer torque spin torque memory cell 10 may be used to construct a memory device where a data bit is stored in the spin torque memory cell by changing the relative magnetization state of free layer 12 with respect to pinned layer 14. The stored data bit can be read out by measuring the resistance of cell 10 which changes with the magnetization direction of free layer 12 relative to pinned layer 14. In order for the spin-transfer torque spin torque memory cell 10 to have the characteristics of a non-volatile random access memory, free layer 12 exhibits thermal stability against random fluctuations so that the orientation of free layer 12 is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy axis defines a preferred direction (i.e., the axis with less total energy stored in the system) of the magnetization.

In accordance with this disclosure, a polarized AC current is added to facilitate switching of the free layer of the memory cell. The addition of the AC current decreases the total current needed to switch the magnetization orientation and thus alter the data state of the memory cell. The addition of the AC current also increases the switching speed. These benefits are enabled by the oscillatory current having a polarization perpendicular to the magnetization in the free layer. The oscillatory current may have a simple form, such as sinusoidal time dependence with a constant frequency within the range of the resonance frequencies exhibited by the free layer, or the oscillatory current may have a more complex form, designed to better match the time-dependent resonant frequency of the free layer. Generation of such a current can be achieved by numerous methods, including using time-dependent oscillations in the pinned layer.

Figure 2:
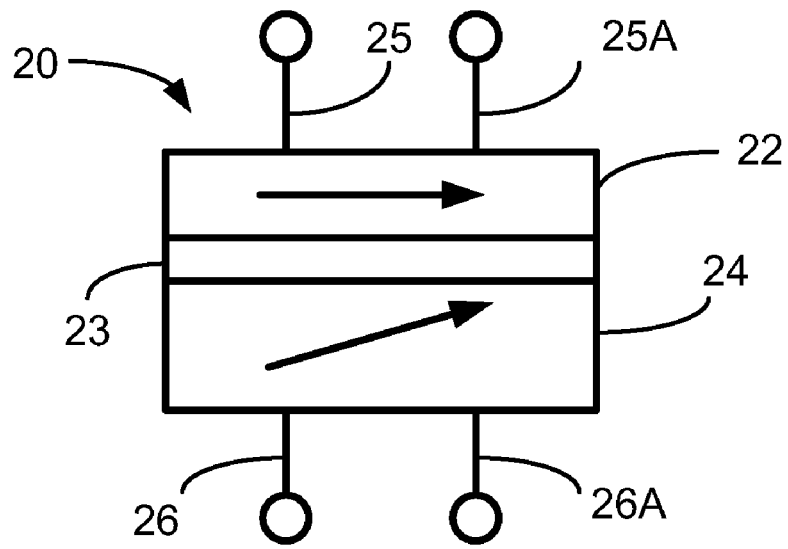
FIG. 2 is a cross-sectional schematic diagram of a spin torque memory cell configured to polarize AC current in accordance with this disclosure.
Figure 3:
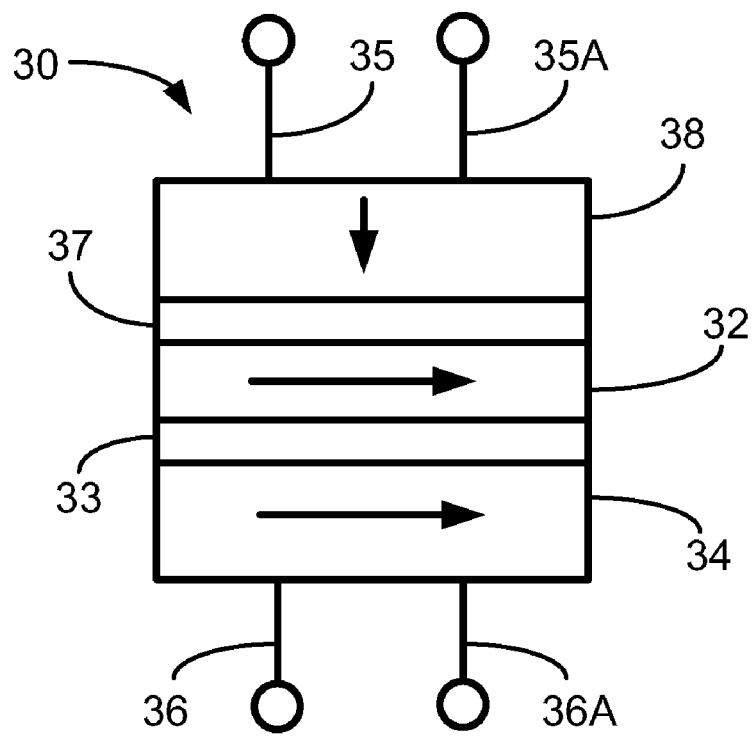
FIG. 3 is a cross-sectional schematic diagram of spin torque memory cell configured to polarize AC current in accordance with this disclosure.

FIGS. 2 and 3 provide embodiments of spin torque memory cells that have their configuration modified from the generic configuration, by adding an AC current source and polarizing the AC current to be at least partially perpendicular to the magnetization orientation of the free layer. The spin torque memory cells of FIGS. 2 and 3 have a switchable magnetic layer that functions as a memory element and another magnetic layer that polarizes the current at least partially in the direction perpendicular to the memory element's magnetization.

FIG. 2 is a cross-sectional schematic diagram of a spin torque memory cell 20 which has the magnetization orientation of the pinned layer canted with respect to the axis of magnetization orientation of the free layer. Cell 20 has a free layer 22, a pinned layer 24 and a barrier layer 23 therebetween. Connected to free layer 22 and pinned layer 24 are electrodes 25, 26, respectively. Electrodes 25, 26 provide DC current to cell 20 to cause a spin transfer torque in free layer 22. The features of the element are generally the same or similar to the elements of the previously discussed embodiments, unless otherwise indicated. In spin torque memory 20, pinned layer 24 has a magnetization orientation that is neither parallel nor anti-parallel to the magnetization orientation of free layer 22; rather, the magnetization orientation of pinned layer 24 is canted or angled, for example at an angle of about 15-75 degrees, e.g., about 45 degrees. This may be due to competition between uniaxial and shape anisotropies. Also for cell 20, connected to free layer 22 and pinned layer 24 are electrodes 25A, 26A, respectively. Electrodes 25A, 26A provide AC current which is polarized by canted pinned layer 24. In some embodiments, this second set of electrodes 25A, 26A may not be present, but rather, both the DC current and AC current are applied via electrodes 25, 26. This polarized current is at an oscillating frequency equal to or in resonance with a resonance frequency of free layer 22. Typically, the AC current and the DC current are applied to cell 20 in opposite directions.

In some alternate embodiments, only DC current or a slowly changing current is applied to the memory cell, rather than the combination of DC current with AC current. Oscillations of the pinned layer (e.g., pinned layer 24) or of an extra ferromagnetic layer, created by application of an external field, are used to generate the additional fast varying polarized AC component. As another alternate embodiment, the spin torque effect produced by the applied DC current can be used to generate the additional fast varying polarized AC component.

FIG. 3 is a cross-sectional schematic diagram of a spin torque memory cell 30 which has an additional layer with a specific purpose of polarizing the AC current perpendicular to the plane of the magnetization orientation of the free layer. Cell 30 has a free layer 32, a pinned layer 34 and a barrier layer 33 therebetween. Cell 30 also has a second pinned layer 38 and a barrier layer 37 positioned between second pinned layer 38 and free layer 32. Connected to second pinned layer 38 and pinned layer 34 are electrodes 35, 36, respectively. Electrodes 35, 36 provide DC current to cell 30 to cause a spin transfer torque in free layer 32. The features of the element are generally the same or similar to the elements of the previously discussed embodiments, unless otherwise indicated. In spin torque memory cell 30, second pinned layer 38 has a magnetization orientation that is neither parallel nor anti-parallel to the magnetization orientation of free layer 32; rather, the magnetization orientation of pinned layer 38 is perpendicular (i.e., 90 degrees) to that of free layer 32. Although the magnetization orientations of free layer 32 and pinned layer 34 are illustrated as parallel, they may be anti-parallel in other embodiments. Also for cell 30, connected to second pinned layer 38 and pinned layer 34 are electrodes 35A, 36A, respectively. Electrodes 35A, 36A provide AC current which is polarized by second pinned layer 38. In some embodiments, this second set of electrodes 35A, 36A may not be present, but rather, both the DC current and AC current are applied via electrodes 35, 36. This polarized current is at an oscillating frequency equal to or in resonance with a resonance frequency of free layer 32. Typically, the AC current and the DC current are applied to cell 30 in opposite directions.

Any number of alternative configurations could be implemented as well, all based on the principle of having one magnetic layer as a memory element (e.g., free layer 22 or free layer 32) and another magnetic layer (e.g., pinned layer 24 or pinned layer 38) that polarizes the current at least partially in the direction perpendicular to the memory element's magnetization. In some alternate embodiments, the magnetization of the free layer may be canted. In accordance with this disclosure, the memory element layer and the polarizing magnetic layer are canted in relation to each other, so that the polarizing magnetic layer has sufficient perpendicular anisotropy such that it causes, via the spin momentum transfer effect, spin polarization of the conducting electrons in the free layer to produce a spin torque on the local magnetization. The perpendicular anisotropy may be formed, for example, by an external magnetic field applied during the manufacturing of either layer.

A magnetic memory device according to this disclosure has a memory cell (e.g., cell 20 or cell 30); a mechanism to apply an AC current (e.g., electrodes 25A, 26A or electrodes 35A, 36B) to the memory magnetic layer (e.g., free layer 22 or free layer 32) produce a polarized time dependent (AC) current and to couple the oscillating current to the free magnetic layer in the memory cell; and a mechanism to apply a DC current (e.g., electrodes 25, 26 or electrodes 35, 36) across the memory cell to cause a spin transfer torque in the free layer. The AC current facilitate the magnetization switching of the memory layer (e.g., free layer 22 or free layer 32) by decreasing the amplitude of DC current needed. In some embodiments, the AC current alone can switch the magnetization without the DC current.

To model the magnetization switching in the free layer (e.g., free layer 22 or free layer 32), a combination of the Landau-Lifshitz equation in the presence of a dissipative Gilbert term and a spin transfer torque is used:

$$\frac{dm}{dt} = -\gamma m \times h \quad (1)$$

where $$h = h^{true} + \frac{m}{M_s} \times (\beta h^{true} - Ih^J) \quad (2)$$

and where m is the magnetic moment and $\gamma$ is the gyromagnetic ratio. The combined effects of dissipation and a spin polarized current are modeled by the term $m/M_s \times [\beta h^{true} - Ih^J]$, where $\beta$ is a parameter governing the dissipation, $h^J$ is the polarization of the current, and I is an empirical factor measuring the strength of the coupling (in units of magnetic field).

In this example, I=1000 Oe corresponds to approximately $10^8$ A/cm$^2$; the free layer is a 2 nm thick permalloy ellipse with principal diameters of 130×70 nm. An exchange stiffness A=1.3×10$^{-6}$ erg/cm and a saturation magnetization $M_s$=795 emu/cm$^3$ are assumed. Thus, a current of 1 mA should correspond to $a_J \approx 144$ Oe, and the damping coefficient $\beta$ is 0.014. The magnetization in the free layer is a single dipole, with shape effects being included through a demagnetization tensor, $A_{\alpha\beta}$:

$$H_\alpha = \sum_\beta A_{\alpha\beta} M_\beta. \quad (3)$$

For the above-mentioned ellipse (130×70 nm), the numerically-estimated principal elements are $A_{zz}$=−0.27, $A_{yy}$=−0.61, and $A_{xx}$=−11.69. It is assumed that there are no external fields acting on a free layer. A coordinate system in which the z-axis lies along the easy magnetization axis and the free layer lies in y-z plane is used.

Since the effectiveness of the method of this disclosure (i.e., adding a polarized AC current) is based on utilizing the resonant properties of a magnetic layer, the time-dependency of the applied AC current needs to be adjusted to approximately match the, in general, the time-dependent resonant frequency of the layer. This may be done in several ways.

A first embodiment is to generate AC current with a constant frequency and generate a series of bipolar current pulses which follow the changes in the frequency of the uniform mode. In one particular example, an AC current of 0.15 mA, polarized perpendicular to the free layer, and a DC current, polarized along the semi-major axis of the free layer, are applied. At optimal frequency (approximately 0.66 of a small angle resonant frequency) the DC current needed to switch the magnetization is reduced significantly due to the presence of the AC current. The width of the frequency window during which the switching current is reduced is proportional to the strength of the AC current.

Figure 4:
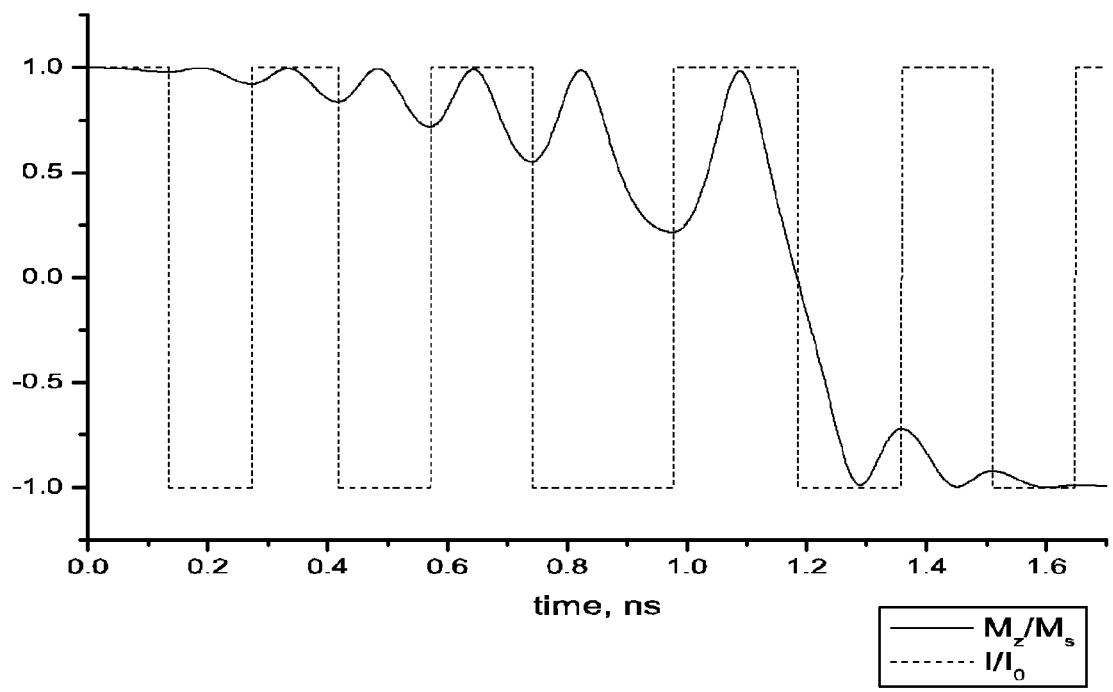
FIG. 4 is graphical representation of magnetization as a function of time for switching with an optimized sequence of square pulses.

A second embodiment is to use "chirped" AC pulses, a particular implementation of which is shown in FIG. 4. The specific numerical values indicated in FIG. 4 were obtained by modeling for a specific set of spin torque memory cell and current value parameters. In FIG. 4, the magnetization $M_z/M_s$ is illustrated as a function of time for switching with an optimized sequence of square pulses with an amplitude $I_0$=0.17 mA. The chirped AC pulses constantly resonantly excite the uniform precession of the magnetization, which corresponds to $a_J$ having the opposite sign to the value of $M_x M_z$, so that the switching can be performed with small AC current, even in the absence of a DC current. Levels as low as 0.05 mA of AC current reduce the DC current switching threshold to 0.3 mA. Switching speed is also greatly reduced, dependant on the value of applied AC current.

Figure 5:
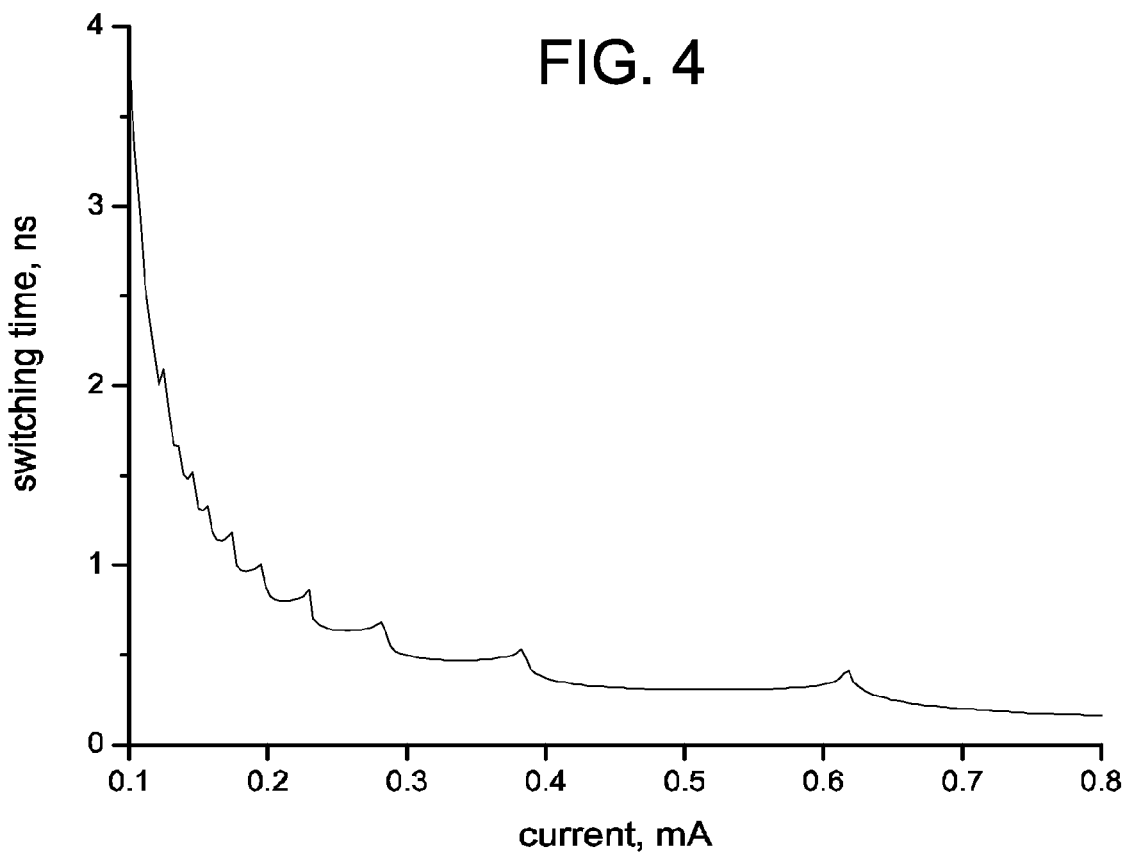
FIG. 5 is a graphical representation of switching time as a function of AC current amplitude, with no DC current present.

FIG. 5 illustrates the switching time as a function of chirped AC current amplitude, in the absence of DC current. The numerical values indicated in FIG. 5 were obtained by modeling for a specific set of spin torque memory cell and current value parameters. The switching speed determines the amplitude of the AC current as well as the number of pulses applied −1 (one) pulse or semi-static case for the current stronger than 0.63 mA, 2 (two) pulses between 0.63 and 0.38 mA, etc. The use of only three pulses significantly decreases the requirements imposed on the AC current while maintaining very high switching speed. The use of just a few pulses also prevents the dephasing effects, caused by the deviation of pulses' width from the optimal value and the variation of resonant frequencies of individual memory elements, to accumulate, therefore improving the method's robustness.

Although the previous discussion has been directed to using a single AC current, in some embodiments, it may be desired to use AC currents with multiple frequencies, for example, two distinct frequencies. The current sequence can be designed in varying height steps, for example, varying in two-steps, three steps, etc. The time period of the current at each step level and that transition of current from one step level to another can be designed according to the magnetization dynamics. Magnetization reversal will occur at low current amplitude.

By using chirped AC pulses, the spin torque is adjusted in accordance with the magnetization in the dynamic process. Therefore, the time-varying spin torque helps the magnetization reversal all the time. Magnetization reversal can thus be achieved by smaller spin torque created by less DC current.

The spin torque memory cells and memory structures of this disclosure may be made by well-known thin film building and removal techniques such as chemical vapor deposition (CVD), physical vapor deposition (PVD), atomic layer deposition (ALD), photolithography, dry etching, wet etching, or ion milling.

The production of chirped currents or current pulses can be done with a special current generator that can generate the short pulses with the needed time dependence. As another source, the oscillations of magnetization in the polarization magnetic layer (e.g., in pinned layer 24 or pinned layer 38) that occur either due to interaction with the external fields or spin torque from the applied current can be adapted in order to generate the needed time dependence.

Thus, embodiments of the OSCILLATING CURRENT ASSISTED SPIN TORQUE MAGNETIC MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory unit comprising:
   a spin torque memory cell having a ferromagnetic free layer, at least one ferromagnetic pinned layer and a spacer layer therebetween, the free layer having a switchable magnetization orientation with a switching threshold;
   a DC current source electrically connected to the spin torque memory cell to cause spin transfer torque in the free layer; and
   an AC current source configured to apply an AC current through the spin torque memory cell to produce an oscillatory polarized current capable of spin transfer torque via resonant coupling with the free layer.

2. The memory unit of claim 1, wherein the spin transfer torque by the AC current and by the DC current in combination exceed the switching threshold.

3. The memory unit of claim 1, wherein the spin transfer torque by the AC current exceeds the switching threshold.

4. The memory unit of claim 1, wherein the polarized current is a fast varying time dependent current.

5. The memory unit of claim 1, wherein the AC current source utilizes the DC current source.

6. The memory unit of claim 1, wherein the AC current source uses precession of magnetization to generate the oscillatory polarized current.

7. A magnetic memory unit comprising:
   a spin torque memory cell having a ferromagnetic free layer, at least one ferromagnetic pinned layer and a spacer layer therebetween, the free layer having a switchable magnetization orientation with a switching threshold;
   a spin transfer torque source electrically connected to the memory cell for spin transfer torque in the free layer, the source configured to apply a DC current and a polarized AC current through the spin transfer torque memory cell.

8. The memory unit of claim 7, wherein the spin transfer torque by the AC current and by the DC current in combination exceed the switching threshold.

9. The memory unit of claim 7, wherein the spin transfer torque by the AC current exceeds the switching threshold.

10. A magnetic memory unit comprising:
    a spin torque memory cell having a ferromagnetic free layer, at least one ferromagnetic pinned layer and a spacer layer therebetween, the free layer having a switchable magnetization orientation;
    a DC current source electrically connected to the spin torque memory cell to cause spin transfer torque in the free layer; and
    an AC current source configured to apply an AC current through the spin torque memory cell, wherein the spin torque memory cell polarizes the AC current at least partially in a direction perpendicular to the magnetization orientation of the free layer.

11. The memory unit of claim 10, wherein the magnetization orientation of the pinned layer is canted in relation to the magnetization orientation of the free layer.

12. The memory unit of claim 11, wherein the magnetization orientation of the pinned layer is about 15-75 degrees to the magnetization orientation of the free layer.

13. The memory unit of claim 11, wherein the magnetization orientation of the pinned layer is perpendicular to the magnetization orientation of the free layer.

14. The memory unit of claim 10, the spin torque memory cell further comprising a second pinned layer proximate the free layer opposite the spacer layer and the pinned layer, the second pinned layer having a magnetization orientation canted in relation to the magnetization orientation of the free layer.

15. A method of switching the magnetization orientation of a free layer of a spin torque magnetic memory cell, the method comprising:
    passing a DC current through the spin torque memory cell to cause spin transfer torque in the free layer; and
    passing an AC current through the spin torque memory cell to produce an oscillatory polarized current capable of spin transfer torque via resonant coupling with the free layer.

16. The method of claim 15, wherein, in combination, the DC current spin transfer torque and the AC current spin transfer torque exceed a switching threshold of the free layer.

17. The method of claim 15, wherein the DC current spin transfer torque exceeds a switching threshold of the free layer.

18. A device comprising:
    a magnetic element having a ferromagnetic free layer, at least one ferromagnetic pinned layer and a spacer layer therebetween, the free layer having a switchable magnetization orientation with a switching threshold;
    a DC current source electrically connected to the magnetic element to cause spin transfer torque in the free layer; and
    an AC current source configured to apply an AC current through the magnetic element to produce an oscillatory polarized current capable of spin transfer torque via resonant coupling with the free layer.

19. The device of claim 18, wherein the spin transfer torque by the AC current and by the DC current in combination exceed the switching threshold.

20. The device of claim 18, wherein the spin transfer torque by the AC current exceeds the switching threshold.

21. The device of claim 18, wherein the polarized current is a fast varying time dependent current.

22. The device of claim 18, wherein the AC current source utilizes the DC current source.

23. The device of claim 18, wherein the AC current source uses precession of magnetization to generate the oscillatory polarized current.

* * * * *